United States Patent
Hollis et al.

(10) Patent No.: US 8,169,220 B2
(45) Date of Patent: May 1, 2012

(54) FLATTENED GRADIENT COIL FOR MRI SYSTEMS

(75) Inventors: Timothy James Hollis, Abingdon (GB); Neil Clarke, Abingdon (GB); Chris Mark Cirel, Eynsham (GB); Bruce Courtney Campbell Amm, Clifton Park, NY (US); Michael Ben Sellers, Kingston Bagpuize (GB)

(73) Assignee: General Electric Company, Schenectady, NY (US)

( * ) Notice: Subject to any disclaimer, the term of this patent is extended or adjusted under 35 U.S.C. 154(b) by 399 days.

(21) Appl. No.: 12/637,997

(22) Filed: Dec. 15, 2009

(65) Prior Publication Data

US 2011/0140695 A1 Jun. 16, 2011

(51) Int. Cl.
*G01V 3/00* (2006.01)
(52) U.S. Cl. ......................................................... 324/318
(58) Field of Classification Search ........... 324/300–322
See application file for complete search history.

(56) References Cited

U.S. PATENT DOCUMENTS

| | | | |
|---|---|---|---|
| 5,574,373 A | 11/1996 | Pausch et al. | |
| 6,462,636 B1 * | 10/2002 | Overweg et al. | 335/299 |
| 6,982,552 B2 | 1/2006 | Hardy et al. | |
| 7,282,916 B2 * | 10/2007 | Eberlein et al. | 324/318 |
| 7,417,432 B2 * | 8/2008 | Overweg | 324/318 |
| 7,605,587 B2 * | 10/2009 | Takeshima | 324/307 |
| 7,852,083 B2 * | 12/2010 | Yatsuo et al. | 324/318 |
| 7,932,722 B2 * | 4/2011 | Amm et al. | 324/318 |
| 2004/0155656 A1 | 8/2004 | Leussler | |
| 2005/0127913 A1 | 6/2005 | Berger | |
| 2008/0094064 A1 | 4/2008 | Eberler et al. | |

FOREIGN PATENT DOCUMENTS

WO 2005088330 A1 9/2005

OTHER PUBLICATIONS

Overweg, J.A. and Weizenecker, J. "A high-efficiency asymmetric Gradient Coil," Proc. Intl. Soc. Mag. Reson. Med. 11 (2003), pp. 744.
GB Search Report issued in connection with corresponding GB Application No. GB1020124.2, Mar. 24, 2011.

* cited by examiner

*Primary Examiner* — Dixomara Vargas

(57) ABSTRACT

A gradient coil and an insert gradient coil for a magnetic resonance imaging system include a primary coil. The primary coil includes an upper primary coil portion and a lower primary coil portion, the lower primary coil portion being less curved in cross-section than the upper primary coil portion. The gradient coil also includes a shielding coil disposed outside of the primary coil. The shielding coil includes an upper shielding coil portion and a lower shielding coil portion, the lower shielding coil portion being less curved in cross-section than the upper shielding coil portion.

22 Claims, 5 Drawing Sheets

FLATTENED GRADIENT COIL FOR MRI SYSTEMS

FIELD OF THE INVENTION

This disclosure relates generally to a gradient coil for a magnetic resonance imaging system.

BACKGROUND OF THE INVENTION

Magnetic resonance imaging (MRI) is a medical imaging modality that can create images of the inside of a human body without using x-rays or other ionizing radiation. MRI uses a powerful magnet to create a strong, uniform, static magnetic field. When a human body, or part of a human body, is placed in the main magnetic field, the nuclear spins that are associated with the hydrogen nuclei in tissue water or fat become polarized. This means that the magnetic moments that are associated with these spins become preferentially aligned along the direction of the main magnetic field, resulting in a small net tissue magnetization along that axis. An MRI system also comprises components called gradient coils that produce smaller amplitude, spatially varying magnetic fields when a current is applied to them. Typically, gradient coils are designed to produce a magnetic field component that is aligned along the z-axis and that varies linearly in amplitude with position along one of the x, y, or z-axes. The effect of a gradient coil is to create a small ramp on the magnetic field strength and, in turn, on the resonant frequency of the nuclear spins along a single axis. Three gradient coils with orthogonal axes are used to "spatially encode" the MRI signal by creating a signature resonance frequency at each location in the body. Radio frequency (RF) coils are used to create pulses of RF energy at or near the resonance frequency of the hydrogen nuclei. The RF coils are used to add energy to the nuclear spins in a controlled fashion. As the nuclear spins then relax back to their rest energy state, they give up energy in the form of an RF signal. This signal is detected by the MRI system and is transformed into an image using a computer and know reconstruction algorithms.

The design of a gradient coil typically involves many compromises. For example, it is desirable to have a gradient coil that produces a highly linear magnetic field while using the smallest amount of current from a power supply. Additionally, it is desirable to have a gradient coil with a fast slew rate, meaning that the gradient coil is capable of producing a high rate-of-change of the magnetic field. It is also desirable to have a gradient coil with a large field-of-view (FOV). As is well-known by those skilled in the art, increasing the diameter of a conventional gradient coil will necessitate a stronger gradient coil. In order to produce a stronger field, the gradient coil will need more turns of a conductor and/or more current from the power supply. Also, if the gradient coil is stronger, it will be much more difficult to achieve a high slew rate. For these and other reasons, there is a need for a gradient coil with improved performance.

BRIEF DESCRIPTION OF THE INVENTION

The above-mentioned shortcomings, disadvantages and problems are addressed herein which will be understood by reading and understanding the following specification.

In an embodiment, a gradient coil for a magnetic resonance imaging system includes a primary coil. The primary coil includes an upper primary coil portion and a lower primary coil portion, the lower primary coil portion being less curved in cross-section than the upper primary coil portion. The gradient coil also includes a shielding coil disposed outside of the primary coil. The shielding coil includes an upper shielding coil portion and a lower shielding coil portion, the lower shielding coil portion being less curved in cross-section than the upper shielding coil portion.

In an embodiment, a gradient coil for a magnetic resonance imaging system includes a primary coil defining a patient bore. The primary coil is a first shape that is larger in an x-direction than in a y-direction. The gradient coil also includes a shielding coil disposed outside of the primary coil. The shielding coil is configured to reduce the magnetic field created by the primary coil in a region outside of the shielding coil. The shielding coil is a second shape that is larger in the x-direction than in the y-direction.

In another embodiment, an insert gradient coil for a magnetic resonance imaging system includes a primary coil. The primary coil includes an upper primary coil portion and a lower primary coil portion, the lower primary coil portion being less curved in cross-section than the upper primary coil portion. The insert gradient coil also includes a shielding coil disposed outside of the primary coil. The shielding coil includes an upper shielding coil portion and a lower shielding coil portion, the lower shielding coil portion being less curved in cross-section than the upper shielding coil portion.

Various other features, objects, and advantages of the invention will be made apparent to those skilled in the art from the accompanying drawings and detailed description thereof.

DETAILED DESCRIPTION OF THE INVENTION

In the following detailed description, reference is made to the accompanying drawings that form a part hereof, and in which is shown by way of illustration specific embodiments that may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken as limiting the scope of the invention.

Figure 1:
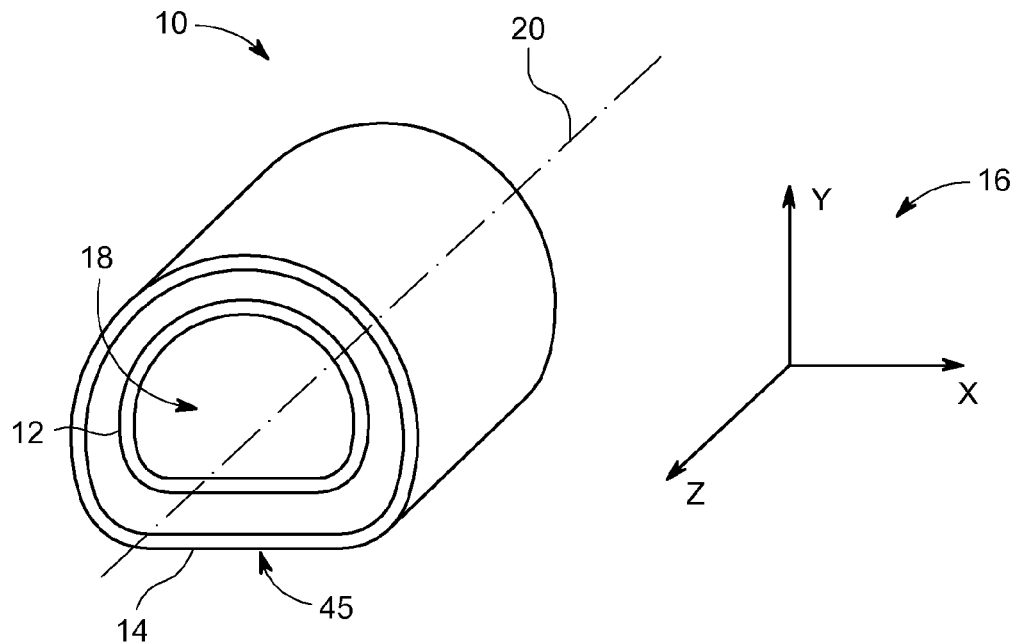
FIG. 1 is a schematic representation of a gradient coil in accordance with an embodiment.

Referring to FIG. 1, a schematic representation of a gradient coil 10 is shown in accordance with an embodiment. The gradient coil 10 includes a primary coil 12 and a shielding coil 14. The primary coil 12 is responsible for generating a magnetic field that varies in a linear manner. The primary coil 12 includes an a primary x-coil (shown in FIG. 3), a primary y-coil (shown in FIG. 3) and a primary z-coil (shown in FIG. 3). By controlling the relative contributions of the primary x-coil, the primary y-coil and the primary z-coil, the strength of the linearly varying magnetic field may be adjusted.

The gradient coil 10 represented in FIG. 1 is depicted as aligned with a z-axis as represented by coordinate axis 16. The primary gradient coil 12 defines a patient bore 18 and a longitudinal axis 20. The longitudinal axis 20 of the gradient coil 10 is aligned with the z-axis as well. For purposes of this disclosure, the longitudinal axis of the gradient coil 10 will be assumed to be parallel to the z-axis for cylindrical magnetic resonance imaging (MRI) systems.

The shielding coil 14 is disposed outside of the primary coil 12. The shielding coil 14 comprises turns of a conductive material configured to carry current in an opposite direction as the primary gradient coil 12. Like the primary coil 12, the shielding coil 14 includes a shielding x-coil (not shown), a shielding y-coil (not shown), and a shielding z-coil (not shown). The x-coil, the y-coil, and the z-coil of both the primary coil and the shielding coil will be discussed in more detail hereinafter. The shielding coil 14 is configured to create a magnetic field that is substantially the opposite of the field created by the primary coil 12 for regions outside of the shielding coil 14. For example, the shielding coil 14 is designed to minimize the stray fields from the primary coil 12 that might otherwise induce eddy currents in other conducting structures, such as a cryostat (not shown). It is important to minimize the production of eddy currents in order to prevent the generation of time-varying magnetic fields that would otherwise negatively impact the performance of the MRI system.

Figure 2:
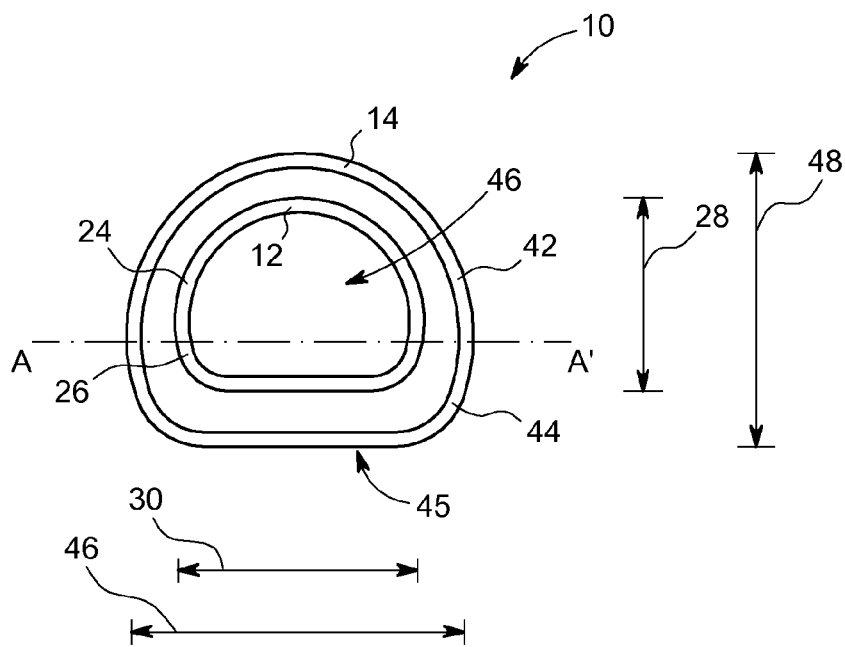
FIG. 2 is a cross-sectional view of a gradient coil in accordance with an embodiment.

Referring to FIG. 2, a cross-section of the gradient coil 10 is show in accordance with an embodiment. The cross-section is perpendicular to the longitudinal axis 20 (shown in FIG. 1). For purposes of this disclosure, the term "cross-section" will be defined to include a cross-section that is perpendicular to the longitudinal axis 20 of the gradient coil 10. According to an embodiment, the primary coil 12 includes both an upper primary coil portion 24 and a lower primary coil portion 26. The line A-A' is shown to clearly show the separation of the upper primary coil portion 24 and the lower primary coil portion 26. According to an embodiment, the upper primary coil portion 24 includes all of the primary coil 12 above the line A-A' and the lower primary coil portion 26 includes all of the primary coil 12 below the line A-A'.

According to the embodiment shown in FIG. 2, the lower primary coil portion 26 is less curved in cross-section than the upper primary coil portion 24. In accordance with an exemplary embodiment, the cross-section of the upper primary coil portion 24, as viewed perpendicularly to the longitudinal axis 20 (shown in FIG. 1), comprises a shape with a curve of a generally constant radius. Other embodiments may have an upper primary coil portion with a non-constant radius of curvature. For example, according to another embodiment, the upper primary coil portion may be elliptical in cross-section. The lower primary coil portion 26 is less curved in cross-section than the upper primary coil portion 24. According to the embodiment shown in FIG. 2, the lower primary coil portion 26 comprises a shape with a flat portion. Other embodiments may comprise shapes with a lower primary coil portion that is curved in cross-section. However, for all embodiments, the lower primary coil portion 26 is less curved in cross-section than the upper primary coil portion 24. In other words, the cross-section of the lower primary coil portion 26 may comprise either a flat section, or a section with a larger radius of curvature than the upper primary coil portion 24.

Still referring to FIG. 2, a height 28 is less than a width 30 of the primary gradient coil 12. Since the lower primary coil portion 26 is flatter in cross-section than the upper primary coil portion 24, the lower primary coil portion 26 is closer to the object or patient being imaged. Typically, the patient would be positioned inside the primary gradient coil 12 with his/her back adjacent to the lower primary coil portion 26. By utilizing a lower primary coil portion 26 with a flatter cross-section, the lower primary coil portion 26 is closer to the patient than in a conventional design.

The gradient coil 10 is capable of functioning more efficiently than a conventional design because the lower primary coil portion 26 is closer to the region of interest that will be imaged in the patient. The magnetic field created by the gradient coil 10 decreases according the inverse square law, which says that the field strength decreases according to the inverse of the distance squared. Moving the lower primary coil portion 26 closer to the region of interest may enable the design of a better performing gradient coil 10. For example, the gradient coil 10 may be able to use fewer turns of a conductor to get the desired field strength. Using fewer turns of a conductor allows the use of a less powerful driver to supply the necessary current. Using a conductor with fewer turns may also allow the gradient coil 10 to have a faster maximum slew rate for equivalent hardware compared to a conventional gradient coil. Or, the gradient coil 10 may be designed to use the same number of turns of a conductor as a conventional gradient coil and benefit from a stronger magnetic field. It should be appreciated by those skilled in the art that some embodiments may benefit from both a stronger field undo faster slew rate.

Figure 3:
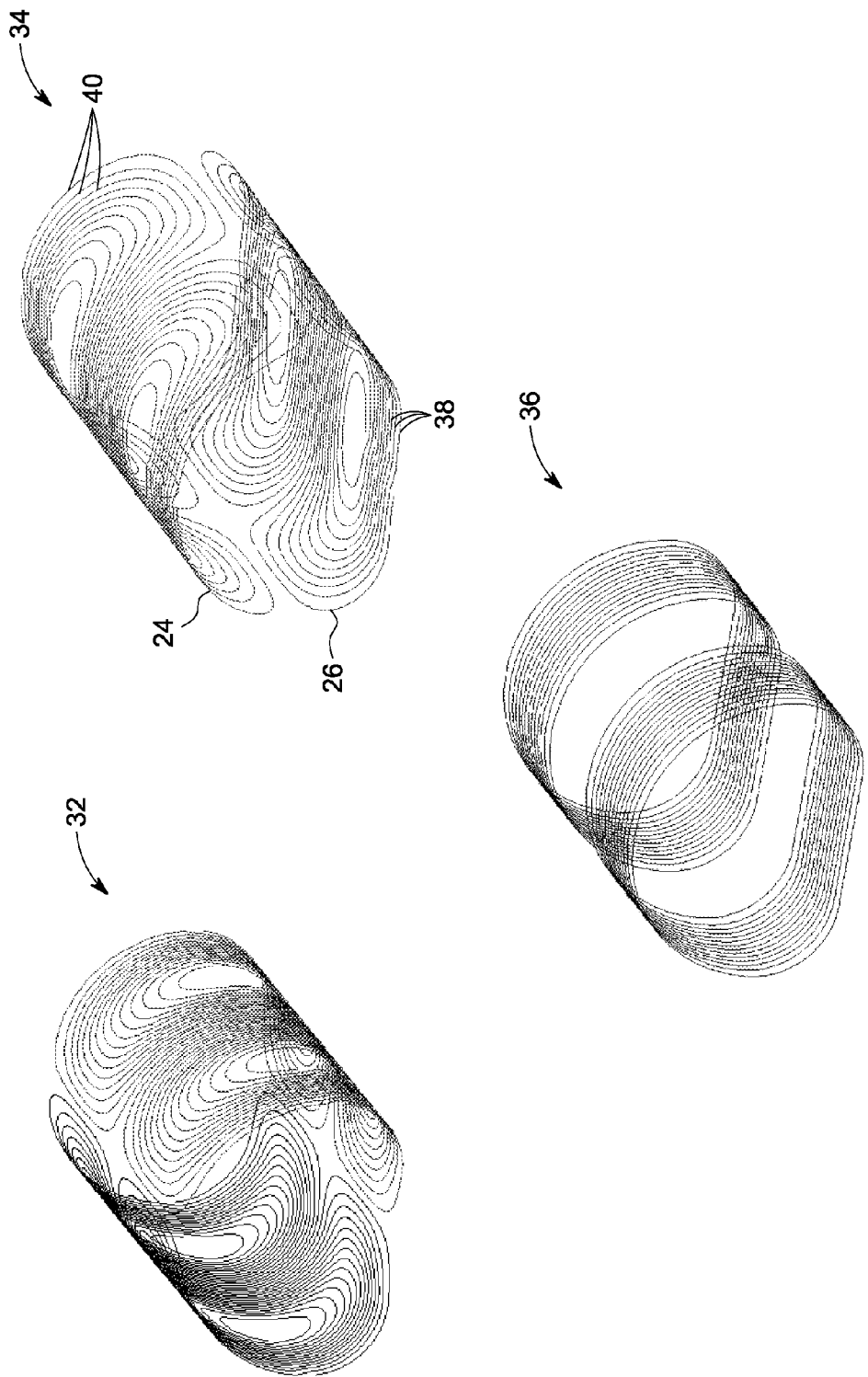
FIG. 3 is a schematic representations of a primary x-coil, a primary y-coil and a primary z-coil.

Referring to FIG. 3, schematic representations of a primary x-coil 32, a primary y-coil 34, and a primary gradient coil z-coil 36 are shown. The primary x-coil 32, the primary y-coil 34 and the primary z-coil 36 fit together in a concentric manner. According to one exemplary embodiment, the primary z-coil 36 may be the innermost, the primary y-coil 34 may be outside the primary z-coil 36, and the primary x-coil 32 may be outside the primary y-coil. The primary x-coil, the primary y-coil and the primary z-coil may be arranged differently according to other embodiments. Each of the primary x-coil 32, the primary y-coil 34 and the primary z-coil are comprised of a conductor that makes a plurality of turns. The strength of each coil is determined by the number of turns, the spacing of the turns and the amount of current flowing through the conductor. According to the embodiment represented in FIG. 3, the y-coil comprises a separate set of turns for the upper primary coil portion 24 and the lower primary coil portion 26. A first plurality of turns 38 is shown on the lower primary coil portion 26 and a second plurality of turns 40 is shown on the upper primary coil portion 24.

Referring back to FIG. 2, the shielding coil 14 is comprised of an upper shielding coil portion 42 and a lower shielding coil portion 44. The line A-A' represents the separation of the upper shielding coil portion 42 from the lower shielding coil portion 44. The upper shielding coil portion 42 is the part of the shielding coil above the line A-A' and the lower shielding coil portion 44 is the part of the shielding coil below the line A-A'. The shielding coil 10 is disposed outside of the primary coil 12. According to an embodiment represented in FIG. 2, the shielding coil 14 is generally the same shape in cross-section as the primary coil 12. The lower shielding coil portion 44 is less curved than the upper shielding coil portion 42 in cross-section. According to the embodiment depicted in FIG. 2, the lower shielding coil portion defines a substantially flat bottom surface 45.

The shielding coil 14 is configured to reduce the magnetic field created by the primary coil 12 in the region outside of the shielding coil 14. In order to substantially cancel the magnetic field generated by the primary coil 12, the shielding coil 14 is configured to have current flow in the opposite direction as in the primary coil 12. Since the primary coil is comprised of a primary x-coil, a primary y-coil and a primary z-coil, the shielding coil is comprised of a shielding x-coil, a shielding y-coil and a shielding z-coil to substantially block the magnetic field from the primary coil. According to an embodiment, the shielding x-coil, the shielding y-coil and the shielding z-coil are each comprised of a conductive material that makes a plurality of turns, in a manner similar to the primary coil. However, the spacing and/or the number of the turns in the shielding coil 14 may be different than in the main coil. For example, according to an embodiment, the shielding coil 14 has fewer turns than the primary coil 12 because the shielding coil 14 is outside of the primary coil 12 and thus closer to the volume where shielding is desired. The shielding coil 14 has a width 46 that is greater than a height 48.

Now referring to FIG. 2 and FIG. 3, the primary coil 12 and the shielding coil 14 may be electrically interconnected in accordance with an embodiment. For example, the primary x-coil 32 and the shielding x-coil (not shown) may be comprised of a single conductive path. The primary y-coil 34 and the shielding y-coil (not shown) may be comprised of a single conductive path. Also, the primary z-coil 36 and the shielding z-coil (not shown) may be comprised of a single conductive path. Electrically connecting the primary coil 12 to the shielding coil 14 may help ensure that optimal shielding performance is always maintained.

The primary coil 12 and the shielding coil 14 may be configured so that the gradient coil 10 does not experience significant net torque or significant net thrust during operation within a MRI system. The techniques needed to design a gradient coil that operates with minimal net torque and minimal net thrust are well-known by those skilled in the art and, therefore, will not be described in detail.

There are multiple benefits to having the lower shielding coil portion 44 with a shape that is less curved in cross-section than the upper shielding coil portion 42, as in the embodiment illustrated in FIGS. 1 and 2. First, by having the lower shielding coil portion 44 about the same distance away from the primary coil 12 as in the upper shielding coil portion 42, there are fewer issues with "over-shielding" the primary coil 12. Second, since the lower shielding coil portion 44 is flatter, the gradient coil 10 is more well-suited for use as an insert coil, which will be discussed in more detail hereinafter.

Figure 4:
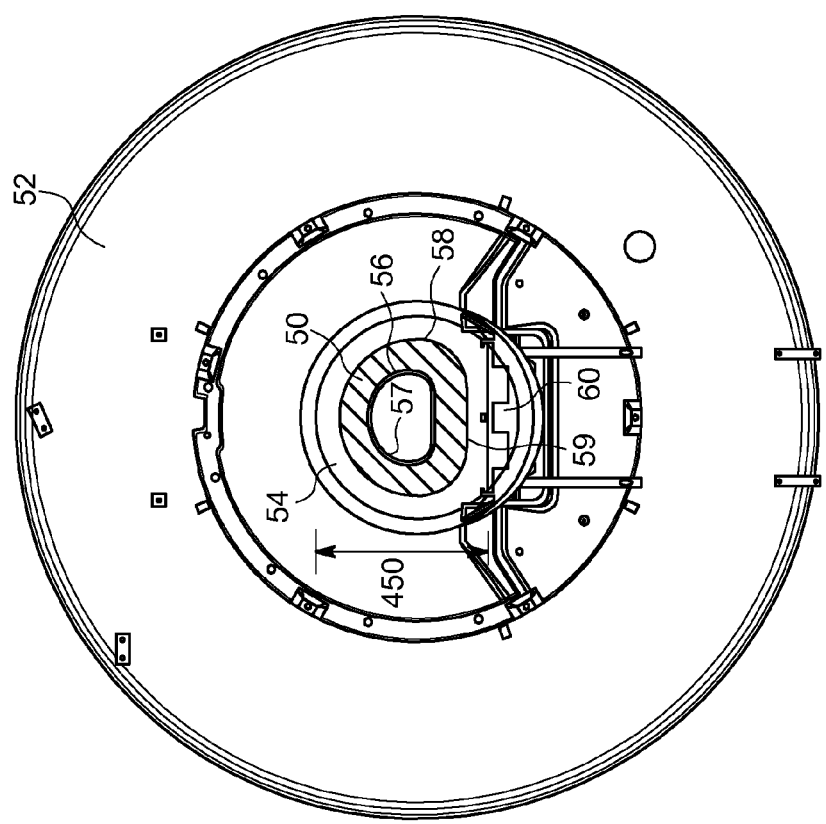
FIG. 4 is a schematic representation of an insert gradient coil within a magnetic resonance imaging system in accordance with an embodiment.

Referring to FIG. 4, a schematic representation of an insert gradient coil 50 is shown within a magnetic resonance imaging (MRI) system 52. The insert gradient coil 50 is positioned within a main bore 54 of the MRI system 52. The insert gradient coil 50 comprises a primary coil 56 and a shielding coil 58 in a manner similar to the embodiment shown in FIGS. 1 and 2. The insert gradient 50 may also include a RF shield 57 disposed on the inside of the primary coil 56 in accordance with an embodiment. The shielding coil 58 of the embodiment shown in FIG. 4 comprises a shape with a substantially flat bottom surface 59. The substantially flat bottom surface 59 allows the insert gradient coil 50 to be easily inserted into the main bore 54 of MRI system 52. For example, the insert gradient coil 50 may be inserted without removing the patient table (not shown). According to another embodiment, the insert gradient coil 50 may be inserted on top of a rail 60.

Figure 5:
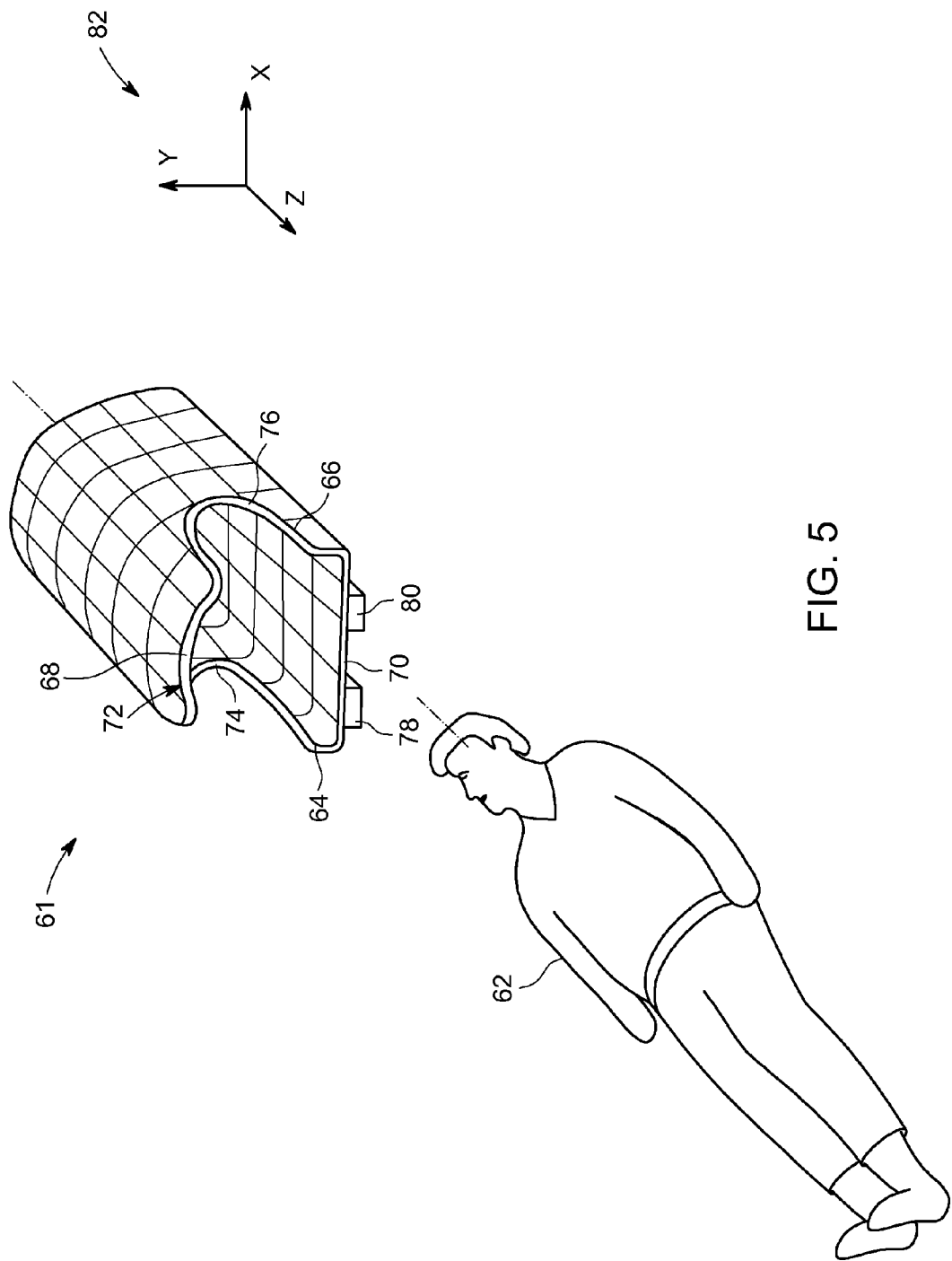
FIG. 5 is a schematic representation of an insert gradient coil in accordance with an embodiment

Referring to FIG. 5, a schematic representation of an insert gradient coil 61 is shown in accordance with another embodiment. The insert gradient coil 61 is adapted for imaging a head of a patient 62. The insert gradient coil 61 comprises a primary coil 64 and a shielding coil 66 disposed outside of the primary coil 64. The cross-section of both the primary coil 64 and the shielding coil 66 comprising a shape that is flatter on the lower portion, in a manner similar to the embodiment described with respect to FIGS. 1 and 2. However, the insert gradient coil 61 is shaped to form a upper lobe 68 and a lower lobe 70 at a patient receiving end 72. The upper lobe 68 and the lower lobe 70 collectively define a first shoulder cutout 74 and a second shoulder cutout 76. When used to image the head of the patient 62, the upper lobe 68 and the lower lobe 70 allow the patient's head to be inserted further into the insert gradient coil 61 by accommodating the patient's shoulders.

The insert gradient coil 61 also comprises a first member 78 and a second member 80 that are adapted to interface with the rail 60 (shown in FIG. 4) of the MRI system 52 (shown in FIG. 4). The first member 78 and the second member 80 may be shaped so as to fit on the rail 60 in a complementary manner, or the first member 78 and the second member 80 may positively engage the rail 60. Additional embodiments may engage more than one rail or may use a differently shaped interface. The insert gradient coil 61 may also comprise coils that are asymmetric in a z-direction as indicated by the coordinate axis 82. According to an embodiment, the primary coil 64 and the shielding coil 66 may both be configured in a manner so that the linear portion of the gradient field is shifted closer to the patient receiving end 72 of the insert gradient coil 61.

Figure 6:
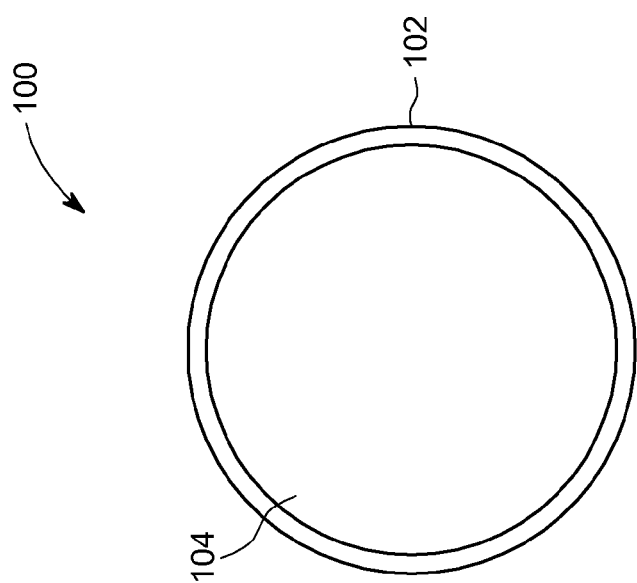
FIG. 6 is a schematic representation of a sectional view of a primary gradient coil in accordance with an embodiment.

Referring to FIG. 6, a schematic representation of a sectional view of a primary gradient coil is shown in accordance with an embodiment. The primary gradient coil 100 comprises a hollow conductor 102. The hollow conductor 102 may be made from copper or any other conductive material. The hollow conductor 102 forms a passageway 104 that is configured to transport a coolant for the purpose of regulating the temperature of the primary gradient coil 100. It should be appreciated by those skilled in the art that a shielding coil may also comprise a structure similar to that shown in the sectional view of FIG. 6.

Figure 7:
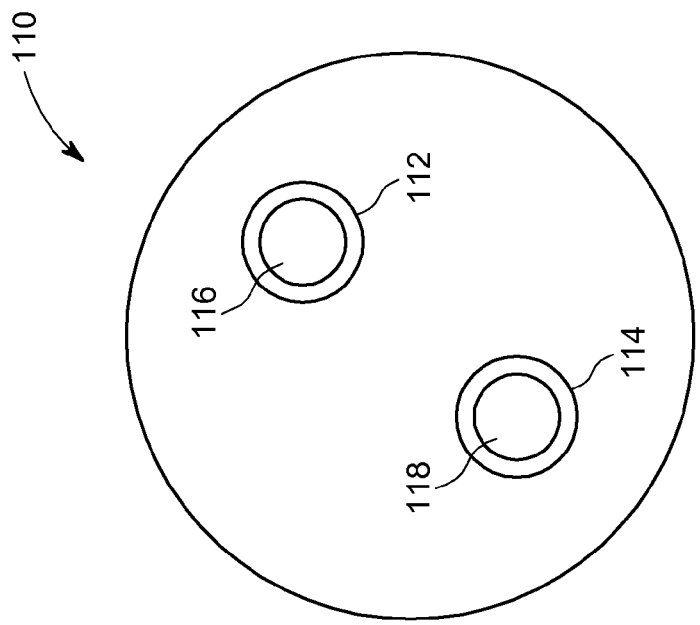
FIG. 7 is schematic representation of a sectional view of a primary gradient coil in accordance with another embodiment.

Referring to FIG. 7, a schematic representation of a sectional view of a primary gradient coil is shown in accordance with another embodiment. The primary gradient coil 110 includes a first conduit 112 and a second conduit 114 disposed within the primary gradient coil 110. The first conduit 112 is configured to transport a coolant within a first passageway 116 and the second conduit 114 is configured to transport a coolant within a second passageway 118. It should be appreciated by those skilled in the art that some embodiments may include only a single conduit while other embodiments may include more than two conduits disposed within the primary gradient coil 110. One or more internal conduits may also be used to cool a shielding coil in accordance with an embodiment.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A gradient coil for a magnetic resonance imaging system, said gradient coil comprising:
a primary coil comprising an upper primary coil portion and a lower primary coil portion, said lower primary coil portion being less curved in cross-section than the upper primary coil portion; and
a shielding coil disposed outside of the primary coil; said shielding coil comprising an upper shielding coil portion and a lower shielding coil portion, said lower shielding coil portion being less curved in cross-section than the upper shielding coil portion.

2. The gradient coil of claim 1, wherein said primary coil defines a patient bore and a longitudinal axis.

3. The gradient coil of claim 2, wherein the cross-section is perpendicular to the longitudinal axis.

4. The gradient coil of claim 1, wherein said primary coil comprises an asymmetric primary coil configured to create a field-of-view that is offset in a z-direction from a center of the gradient coil.

5. The gradient coil of claim 1, wherein said primary coil and said shielding coil are configured to substantially cancel any net thrust force caused by operating said gradient coil.

6. The gradient coil of claim 1, wherein said primary coil and said shielding coil are configured to substantially cancel any net torque caused by operating said gradient coil.

7. The gradient coil of claim 1, wherein at least one of said primary coil and said shielding coil comprises a hollow conductor configured to transport a coolant.

8. The gradient coil of claim 1, further comprising a conduit disposed within the primary coil, said conduit configured to transport a coolant.

9. The gradient coil of claim 1, wherein said lower primary coil portion comprises fewer turns than said upper primary coil portion.

10. The gradient coil of claim 1, wherein said lower shield coil portion comprises fewer turns than said upper shield coil portion.

11. The gradient coil of claim 1, further comprising an RF shield disposed inside of the primary coil.

12. A gradient coil for a magnetic resonance imaging system, said gradient coil comprising:
a primary coil defining a patient bore, said primary coil comprising a first shape that is larger in an x-direction than in a y-direction; and
a shielding coil disposed outside of the primary coil, said shielding coil configured to reduce the magnetic field created by the primary coil in a region outside of the shielding coil, said shielding coil comprising a second shape that is larger in the x-direction than in the y-direction.

13. The gradient coil of claim 12, wherein said shielding coil is separated from said primary coil by a substantially uniform distance.

14. The gradient coil of claim 12, wherein said shielding coil is closer to said primary coil at a lower side of the gradient coil.

15. The gradient coil of claim 12, wherein the primary coil comprises an asymmetric primary coil configured to create a field-of-view that is offset from a center of the gradient coil in a z-direction.

16. The gradient coil of claim 12, wherein said primary coil and said shielding coil are electrically interconnected.

17. An insert gradient coil for a magnetic resonance imaging system, said insert gradient coil comprising:
a primary coil comprising an upper primary coil portion and a lower primary coil portion, said lower primary coil portion being less curved in cross-section than the upper primary coil portion; and
a shielding coil disposed outside of the primary coil; said shielding coil comprising an upper shielding coil portion and a lower shielding coil portion, said lower shielding coil portion being less curved in cross-section than the upper shielding coil portion.

18. The insert gradient coil of claim 17, wherein the lower shielding coil portion comprises a shape defining a substantially flat bottom surface.

19. The insert gradient coil of claim 18, wherein said insert gradient coil is adapted to receive a patient's head.

20. The insert gradient coil of claim 19, wherein the primary coil and the shielding coil are shaped to form an upper lobe and a lower lobe on a patient receiving end of the insert gradient coil, said upper lobe and said lower lobe configured to accommodate a patient's shoulders.

21. The insert gradient coil of claim 18, further comprising a member attached to the outside of the lower shielding portion, said member adapted to interface with a rail of the magnetic resonance imaging system.

22. The insert gradient coil of claim 17, wherein said gradient coil is adapted to be positioned on top of a patient bed within the magnetic resonance imaging system.

* * * * *